United States Patent [19]

Bottka et al.

[11] Patent Number: 4,492,434
[45] Date of Patent: Jan. 8, 1985

[54] MULTI-COLOR TUNABLE SEMICONDUCTOR DEVICE

[75] Inventors: Nicholas Bottka, Ridgecrest, Calif.; Howard Lessoff, Potomac, Md.; Marian E. Hills, Ridgecrest, Calif.

[73] Assignee: The United States of America as represented by the Secretary of the Navy, Washington, D.C.

[21] Appl. No.: 337,659

[22] Filed: Jan. 7, 1982

[51] Int. Cl.$^3$ ................................................ G02F 1/03
[52] U.S. Cl. ................................. 350/356; 350/166; 350/164; 350/316; 372/26; 372/43
[58] Field of Search ............... 350/356, 166, 164, 316; 372/26, 25, 43

[56] References Cited

U.S. PATENT DOCUMENTS

| | | | |
|---|---|---|---|
| 3,307,897 | 3/1967 | Lohmann | 350/160 |
| 3,943,552 | 3/1976 | Shannon et al. | 357/157n |
| 4,350,413 | 9/1982 | Bottka et al. | 350/356 |
| 4,403,397 | 9/1983 | Bottka et al. | 29/572 |

Primary Examiner—William L. Sikes
Assistant Examiner—Léon Scott, Jr.
Attorney, Agent, or Firm—Robert F. Beers; W. Thom Skeer; Kenneth G. Pritchard

[57] ABSTRACT

A semiconductor multi-color filter spectrum analyzer is created by multiple epitaxial layers of varying composition. A DC sweep voltage is used to successively deplete the epitaxial layers. An AC voltage is used to modulate the absorption edge of the individual layers.

A modification of this device concept is a variable bandwidth detector in which the spectral bandwidth is a function of the applied DC voltage.

11 Claims, 7 Drawing Figures

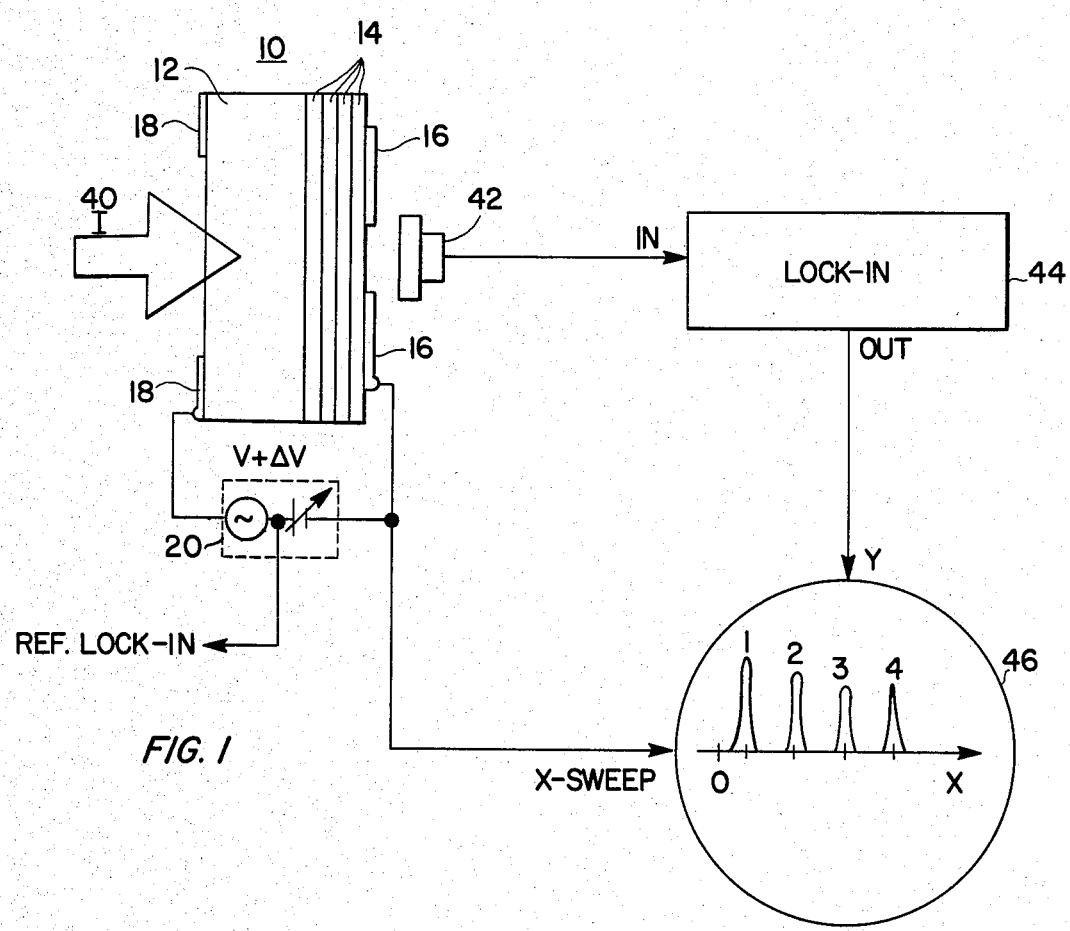
FIG. 1
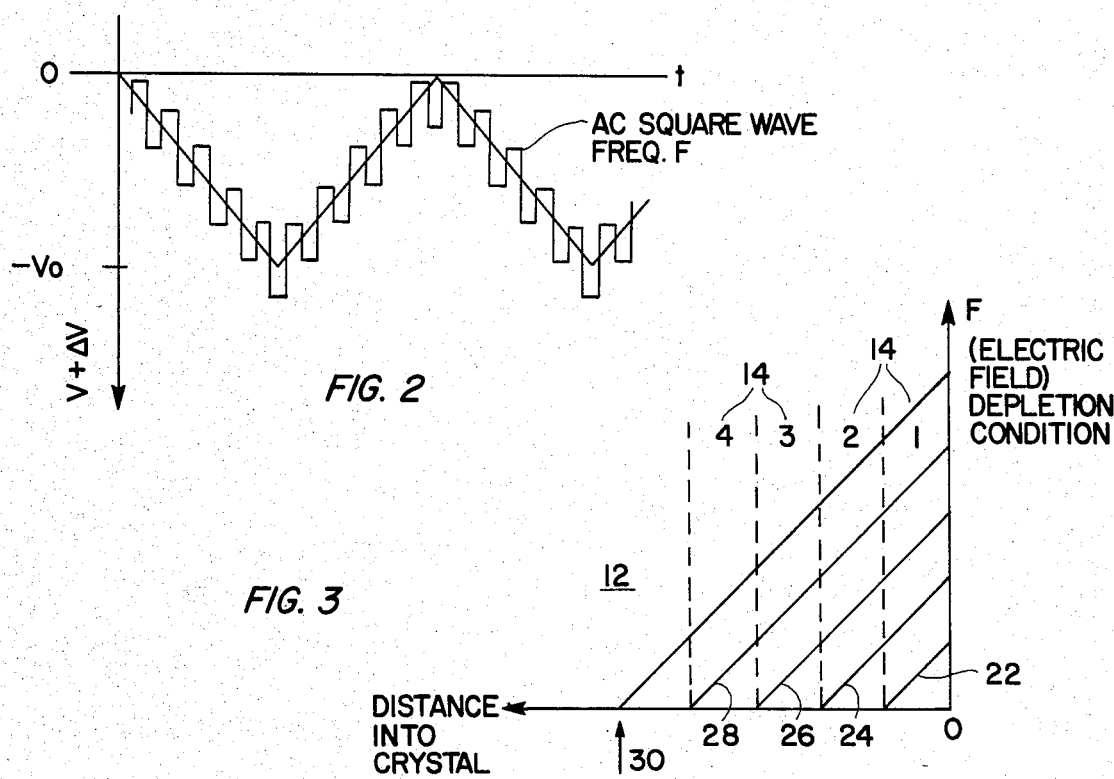
FIG. 2
FIG. 3

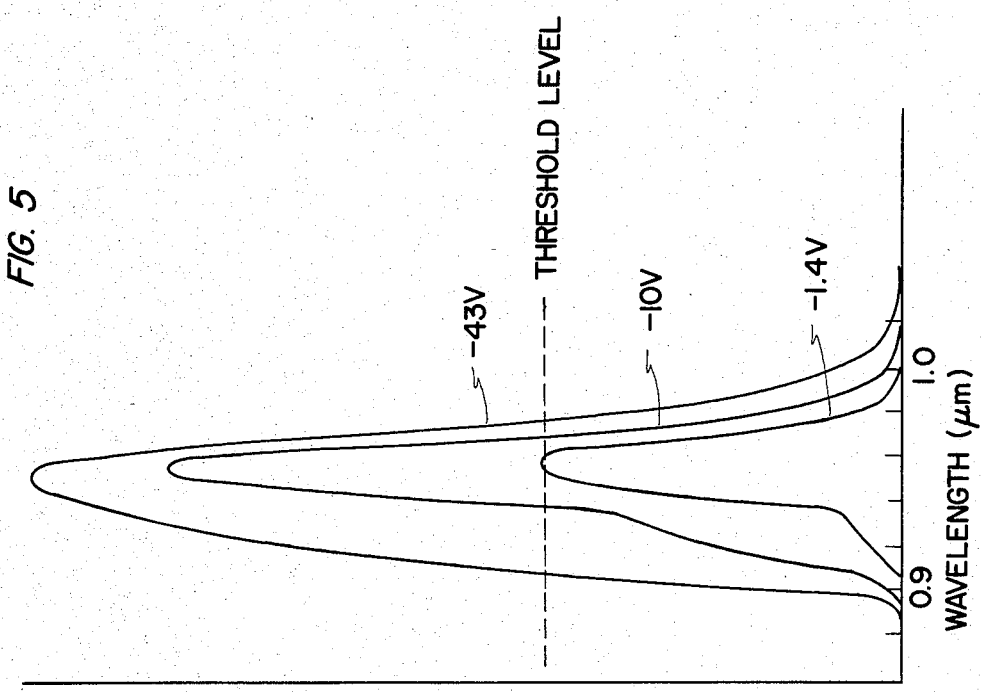
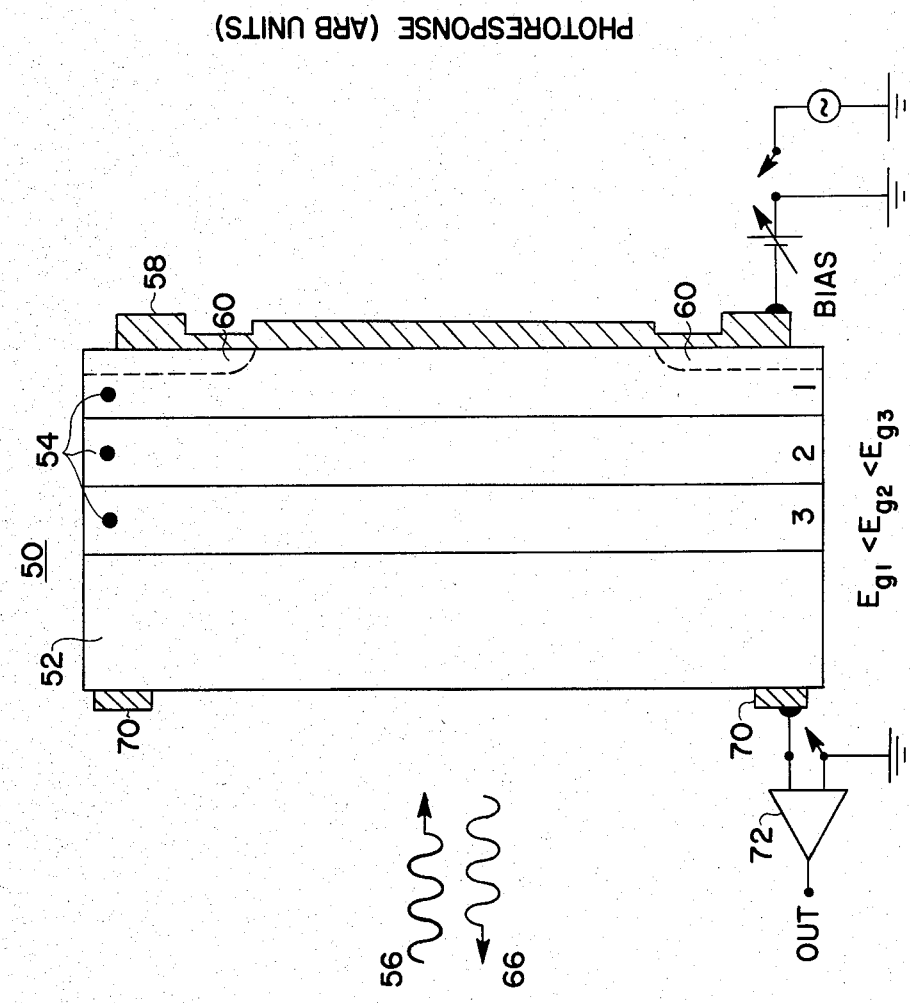
FIG. 5
FIG. 4

MULTI-COLOR TUNABLE SEMICONDUCTOR DEVICE

BACKGROUND OF THE INVENTION

1. Field of the Invention

The present invention is for a semi-conductor filter spectrum analyzer and a variable bandwidth detector.

2. Description of the Prior Art

Modern electromagnetic spectrum studies permit identification of objects by characteristic frequency signatures. In particular, target emission in the infrared region appears to be highly reliable as a means of identifying targets.

Previous detectors have not permitted rapid scanning of several colors. To cover a portion of the spectrum, numerous detectors tuned to narrow adjacent bandwidths have had to be used.

It is also possible to communicate by discrete frequency shifts. However, present lasers can selectively shift frequencies at a faster rate than current receivers can decode. Thus, present receivers limit the rate of communication.

SUMMARY OF THE INVENTION

A filter spectrum analyzer and a variable bandwidth detector, suitable for white light, is made of n-type $GaAs_{1-x}Sb_x$ heterostructures. Light to be analyzed and/or detected is transmitted through a semi-conductor device having a substrate and a plurality of epitaxial layers. By varying the value of x, each layer absorbs a different color, or wavelength. Electrodes are placed on the substrate and outermost epitaxial layer. The electrode on the epitaxial layer is a Schottky barrier contact.

For the spectrum analyzer, a sweeping voltage source capable of depleting across all epitaxial layers is connected to the electrodes and an AC modulating voltage is superimposed upon it. The DC sweep voltage successively depletes the epitaxial layers while the AC voltage of frequency f modulates the individual depleted layer's absorption edge.

In order for the spectrum analyzer to work, the epitaxial layers must be thin so that the light modulated in a particular epitaxial layer is not totally absorbed by subsequent epitaxial layers. In the variable bandwidth detector, the photocarriers are generated only for photon energies equal or greater than the bandgaps of the epitaxial layers. These carriers will be swept out to the contacts and detected only if an externally applied bias overcomes the internal potential barriers.

BRIEF DESCRIPTION OF THE DRAWINGS

FIG. 1 is an embodiment of the present invention as a filter;

FIG. 2 is a type of modulation voltage that can be used with the present invention;

FIG. 3 is a graph of Electric Field vs Distance into crystal for various bias voltages of FIG. 2;

FIG. 4 is an embodiment of the present invention as a detector;

FIG. 5 is an exemplary graph of photoresponse vs wavelength for the FIG. 4 device;

DESCRIPTION OF THE PREFERRED EMBODIMENT

Figure 6:
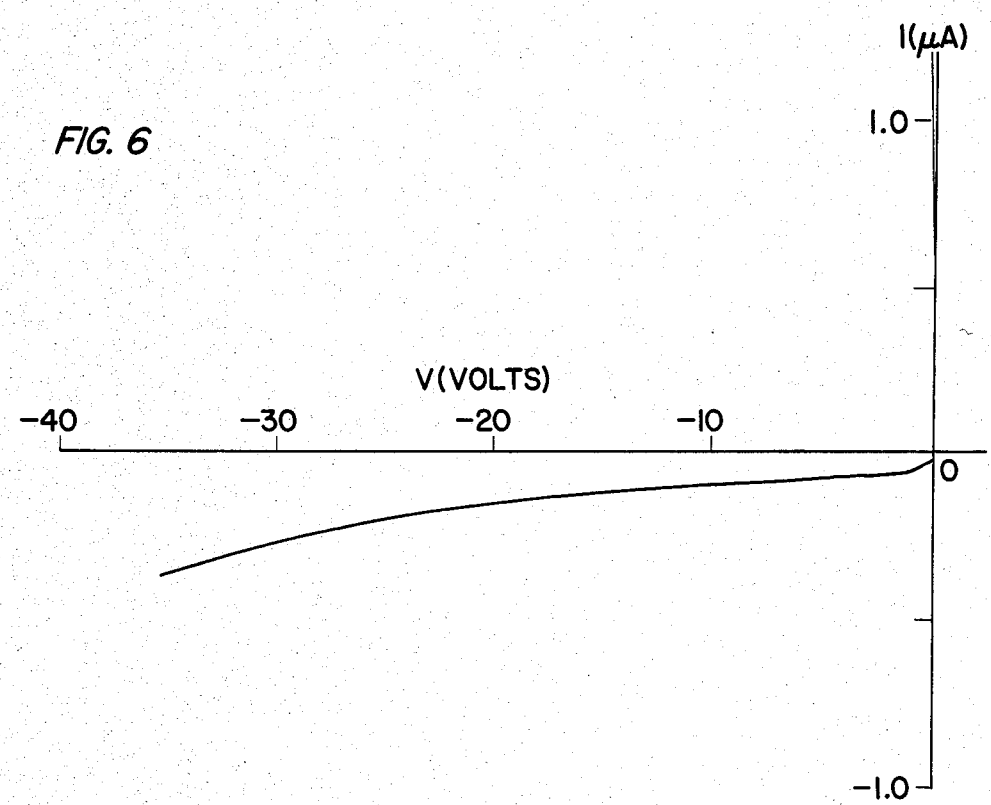
FIG. 6 is an exemplary graph of the response current vs bias voltage for the FIG. 4 device.

In FIG. 1, a semi-conductor device 10 is shown with a substrate 12 and a plurality of epitaxial layers 14. Substrate 12 can be made of n+ GaAs and epitaxial layers 14 can be made of n-type $GaAs_{1-x}Sb_x$ where x equals the mole fraction of GaSb. A total of four epitaxial layers 14 are shown in FIG. 1, but many more can be used. For each epitaxial layer 14, the value of x is different. The value of x is incrementally increased for each layer. This permits lattice matching between layers. Each layer acts as a selective modulable filter for a given color. Epitaxial layers 14 are thin enough to be depleted across with a negative bias voltage, V. To deplete across all layers, a final achievable voltage, $-V_o$, must be obtained. Individual layer thickness of 0.5 to 1.0 μm with a carrier concentration of $10^{16} cm^{-3}$ permit this to be achieved. There must be good lattice matching between epitaxial layers 14 and between the substrate and the first epitaxial layer.

Electrodes are placed on semi-conductor device 10 so a voltage potential can be maintained across it. On the outermost epitaxial layer, an apertured Schottky barrier contact 16 can be used or a p+ thin epitaxial layer. Either configuration permits Schottky barrier contact 16 to be transparent. Schottky contact 16 can be a platinum or palladium gold contact. On substrate 12, ohmic contacts 18 are used. Ohmic contacts 18 can be made of gold-germanium. These electrodes may be placed, as shown in FIG. 1, on the outer surface of the substrate and outer surface of the top epitaxial layer by any of the well known methods, plating, deposition, or even epitaxial growth as previously mentioned. Any method of placement that attaches the electrodes such that an electric field is maintained across the substrate and the epitaxial layers is acceptable.

A variable voltage source 20 is connected to the electrodes of device 10 as shown. Voltage source 20 is capable of providing a sweep bias with an AC modulated voltage superimposed upon it.

More than one active area can be used. The use of proton bombardment is needed to create "dead areas" to prevent cross-talk between the various elements in the various epitaxial layers.

FIG. 2 is a graph of a negative sweeping bias voltage, V, with AC square-wave modulation voltage, ΔV, superimposed. Other voltage vs time relationships can be used, but square-wave modulation on a linear voltage sweep is a straightforward example. The negative sweep bias will cause each successive layer to sustain an electric field. The AC modulating field will periodically shift the fundamental absorption edge of the individual layer that is sustaining an electric field.

FIG. 3 is a graph of electric field vs distance into device 10 or crystal for different biasing voltages. Layer 1, the outermost of epitaxial layers 14 can have a built-in field bias for zero applied voltage as shown by line 22. At increasing applied voltages 24, 26, 28 and 30, the electric field depletion condition extends successively into layers closer to the substrate until the maximum depletion depth is reached at $-V_o$, shown by line 30.

In FIG. 1, incident light 40, which can be polychromatic or monochromatic, enters device 10 with incident intensity I. The portion of incident light 40 which exits device 10 impinges on a detector 42. Detector 42 can be a Si PIN-10 or any detector spanning all the colors in the filter. Detector 42 will measure the change in exit light intensity ΔI for each wavelength of light near the absorption edge of the individual epitaxial layer. Detector 42 is connected to a lock-in amplifier 44 set on the modulating frequency, f. Lock-in amplifier 44 is also connected to a reference signal from variable voltage source 20. The output of lock-in amplifier 44 is connected to a display device 46, such as a cathode ray tube. Display device 46 is also connected to the sweep voltage shown in FIG. 1. Lock-in amplifier 44 senses only the modulated light intensity. If modulation of absorption occurs for a particular wavelength, then that wavelength is present in incident light 40. There is a unique bias voltage associated with each color which lies near the fundamental absorption edge of the epitaxial layers. The FIG. 1 image shows all four layers absorbing light; thus for this example, all four colors capable of being sensed were present in incident light 40.

FIG. 4 shows a variable bandwidth detector 50. The detector can have one or more elements. FIG. 4 shows a one element device as an example. Semi-conductor device 50, a variable bandwidth detector, is similar to device 10 of FIG. 1. Device 50 has a substrate 52, such as an n+ GaAs substrate. Grown on substrate 52 are a plurality of epitaxial layers 54. Three layers are shown, but other numbers of layers can be used. The epitaxial layers form n—n heterostructures of $GaAs_{1-x}Sb_x$ as previously described. The layers are step graded so that gap energies, $E_{g3}$, $E_{g2}$ and $E_{g1}$, decrease as shown in FIG. 4. Ohmic contacts 70 are deposited on substrate 52. Substrate 52 serves as an ohmic contact to layers 54 and as a window to the incident light 56. A Schottky barrier 58 is made on the outermost epitaxial layer. Schottky barrier 58 can be made of palladium or other suitable material. Proton bombardment of selected areas 60 produces guard rings which prevent premature breakdown of the electric field near edges of the Schottky barrier 58 and prevents cross-talk between elements if more than one element is used.

A negative bias is applied to Schottky barrier contact 58, as shown in FIG. 4. The bias can be swept manually or with a ramp generator. Electrode 70 is coupled to an operational amplifier 72. This output can be fed into an x-y recorder 73 which is a means for monitoring the current flow.

FIG. 5 shows the relative photoresponse of the FIG. 4 device for various bias voltages. For the most part, at low bias, only photocarriers generated in the outermost epitaxial layer are collected because only a few of the carriers generated in layer 2 can overcome the built-in n—n heterojunction barrier and contribute to the photocurrent. This low bias response condition is shown by the −1.4 V curve in FIG. 5.

As the bias is increased, the electric field reaches through, or punches through, all the epitaxial layers. Now the photocarriers generated in layers 2 and 3 overcome the n—n heterojunction barriers and, with the aid of the electric field, reach the Schottky contact. The photoresponse resulting from higher bias conditions is shown by the −10 V and −43 V curves. The overall result is a widening of the spectral response from a spectral bandwidth of about 200Å to as much as 1000Å or more depending on the number and composition of epitaxial layers present.

Schottky barrier contact 58 dominates the current-voltage characteristics of this device, as shown in FIG. 6.

Figure 7:
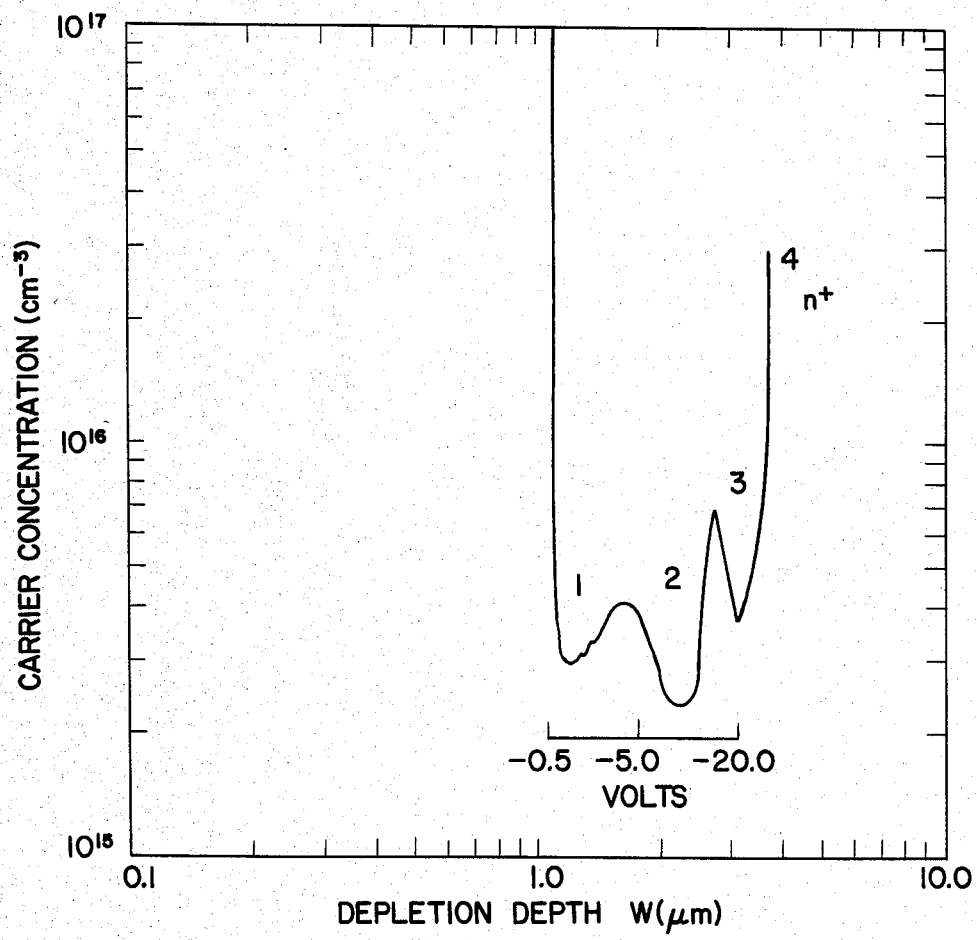
FIG. 7 is an exemplary graph of carrier concentration vs depletion depth for the FIG. 4 device.

The total band tunability depends on the number and composition of the epitaxial layers. For epitaxial layers 1 to 2 μm thick, the applied bias can reach through at least six layers. The reach through condition is verified by doing capacitance-voltage measurements on the device. The carrier concentration is approximately $$N_o \approx C^3 (dv/dC)$$

where
$N_o$ = carrier concentration,
C = capacitance, and
(dv/dC) = the change in voltage per the change in capacitance, and is calculated from the capacitance-voltage measurement and is plotted in FIG. 7 as a function of voltage and depletion depth W. At the n—n heterojunction interfaces, there is an accumulation-depletion condition typical for such n—n heterojunctions.

As the response range widens, this detector detects a broader spectrum. This feature can be used in a digital decoding system where pulses transmitted at various wavelengths need to be sorted.

It is apparent to those skilled in the art that numerous modifications to the above are possible.

What is claimed is:

1. A detector with a variable bandwidth response for light comprising:
   a substrate in the path of said light for transmitting said light;
   a plurality of epitaxial layers on said substrate the outermost epitaxial layer with proton bombarded regions, placed such that said light passes through said plurality of epitaxial layers after passing through said substrate, absorbing selected wavelengths;
   electrodes attached to the outer surface of the substrate and outer surface of the top epitaxial layer, for maintaining an electric field across said substrate and said epitaxial layers such that a current flows between said electrodes if light is absorbed by any of said epitaxial layers;
   means for producing a variable voltage potential across said epitaxial layers in a predetermined manner; and
   means for monitoring the current flow from said epitaxial layers as a function of said voltage potential when light is incident on said detector.

2. A variable bandwidth detector for light as described in claim 1 wherein said electrodes comprise:
   an electrode ring mounted on said substrate; and
   a Schottky barrier contact on the outermost epitaxial layer.

3. A variable bandwidth detector for light as described in either of claims 1 or 2 where said variable voltage source has a sweep bias that depletes across all epitaxial layers in a predetermined manner.

4. A variable bandwidth detector for light as described in claim 1 where said substrate comprises n+ type GaAs.

5. A variable bandwidth detector for light as described in any of claims 1, 2, or 4 wherein said plurality of epitaxial layers are comprised of n-type $GaAs_{1-x}Sb_x$, where x equals the mole fraction of GaSb.

6. A filter spectrum analyzer for light comprising:
   a substrate in the path of said light for transmitting the light;
   a plurality of epitaxial layers on said substrate the outermost epitaxial layer with proton bombarded regions, placed such that said light passes through said plurality of epitaxial layers after passing through said substrate, said epitaxial layers so thin that light modulated in any given layer is not totally absorbed by subsequent epitaxial layers;

electrodes attached to the outer surface of the substrate and outer surface of the top epitaxial layer for maintaining an electric field across said substrate and said epitaxial layer such that a current flows between said electrodes if light is absorbed by any of said epitaxial layers;

a detector in the path of light that has passed through said substrate and epitaxial layers for detecting said light;

means for producing a variable voltage potential across said epitaxial layers in a predetermined manner; and means for monitoring the current flow from said detector as light incident on said detector varies as a function of said voltage potential.

7. A filter spectrum analyzer for light as described in claim 6 where said electrode comprises:
   an electrode ring mounted on said substrate; and
   a transparent Schottky barrier contact on the outermost epitaxial layer.

8. A filter spectrum analyzer for light as described in claim 7 where said outermost epitaxial layer has proton bombarded regions to limit electric field breakdown.

9. A filter spectrum analyzer for light as described in either of claims 6, 7, or 8 where said variable voltage source has a sweep bias that depletes across all epitaxial layers in a predetermined manner.

10. A filter spectrum analyzer for light as described in claim 6 where said substrate comprises n+ type GaAs.

11. A filter spectrum analyzer for light as described in any of claims 6, 7, 8 or 10 wherein said plurality of epitaxial layers are comprised of n type $GaAs_{1-x}Sb_x$, where x equals the mole fraction of GaSb.

* * * * *